United States Patent
Apalkov et al.

(10) Patent No.: US 8,649,214 B2
(45) Date of Patent: Feb. 11, 2014

(54) MAGNETIC MEMORY INCLUDING MAGNETIC MEMORY CELLS INTEGRATED WITH A MAGNETIC SHIFT REGISTER AND METHODS THEREOF

(75) Inventors: Dmytro Apalkov, San Jose, CA (US); Vladimir Nikitin, Campbell, CA (US); Alexey Vasilyevitch Khvalkovskiy, Milpitas, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 193 days.

(21) Appl. No.: 13/332,230

(22) Filed: Dec. 20, 2011

(65) Prior Publication Data
US 2013/0155754 A1    Jun. 20, 2013

(51) Int. Cl.
*G11C 11/15* (2006.01)
(52) U.S. Cl.
USPC ........... 365/173; 365/171; 365/158; 365/145; 365/189.14; 365/189.12; 365/222.5; 365/81; 365/80
(58) Field of Classification Search
USPC ............ 365/173, 171, 130, 158, 145, 189.14, 365/189.15, 189.16, 189.12, 222.5, 51, 66, 365/63, 81, 80
See application file for complete search history.

(56) References Cited

U.S. PATENT DOCUMENTS

| | | | |
|---|---|---|---|
| 3,940,750 A * | 2/1976 | Voegeli | 365/32 |
| 7,190,613 B2 * | 3/2007 | Nagase et al. | 365/171 |
| 7,242,604 B2 * | 7/2007 | Klaeui et al. | 365/145 |
| 7,751,223 B2 | 7/2010 | Kim et al. | |
| 7,796,428 B2 * | 9/2010 | Redon | 365/171 |
| 7,876,595 B2 | 1/2011 | Xi et al. | |
| 7,889,543 B2 | 2/2011 | Morise et al. | |
| 2009/0206426 A1 | 8/2009 | Kajiyama | |
| 2010/0002486 A1 | 1/2010 | DeBrosse et al. | |
| 2011/0102948 A1 | 5/2011 | Apalkov | |

FOREIGN PATENT DOCUMENTS

KR    1020100015039    12/2010

* cited by examiner

*Primary Examiner* — Andrew Q Tran
(74) *Attorney, Agent, or Firm* — Covergent Law Group LLP

(57) ABSTRACT

A magnetic memory includes magnetic memory elements corresponding to magnetic memory cells and at least one shift register. Each magnetic memory element includes a pinned layer, a free layer, and a nonmagnetic spacer layer between the pinned and free layers. The free layer is switchable between stable magnetic states when a write current is passed through the magnetic memory element. The shift register(s) correspond to the magnetic memory elements. Each shift register includes domains separated by domain walls. A domain is antiparallel to an adjoining domain. The shift register(s) are configured such that an equilibrium state aligns a portion of the domains with the magnetic memory elements. The shift register(s) are also configured such that each domain wall shifts to a location of an adjoining domain wall when a shift current is passed through the shift register(s) in a direction along adjoining domains.

22 Claims, 8 Drawing Sheets

MAGNETIC MEMORY INCLUDING MAGNETIC MEMORY CELLS INTEGRATED WITH A MAGNETIC SHIFT REGISTER AND METHODS THEREOF

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional dual magnetic tunneling junction (MTJ) 10 as it may be used in a conventional STT-RAM. The conventional dual MTJ 10 typically resides on a bottom contact 11, uses conventional seed layer(s) 12 and includes a conventional first antiferromagnetic (AFM) layer 14, a first conventional pinned layer 16, first a conventional tunneling barrier layer 18, a conventional free layer 20, a second conventional tunneling barrier layer 22, a second conventional pinned layer 24, conventional second AFM layer 26, and a conventional capping layer 28. Also shown is top contact 30.

Conventional contacts 11 and 30 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layers 18 and 22 are nonmagnetic and are, for example, thin insulators such as MgO.

The conventional pinned layers 16 and 24 and the conventional free layer 20 are magnetic. The magnetizations 17 and 25 of the conventional pinned layers 16 and 24, respectively, are fixed, or pinned, in a particular direction, typically by an exchange-bias interaction with the corresponding AFM layers 14 and 26. Although depicted as a simple (single) layer, the conventional pinned layers 16 and 24 may include multiple layers. For example, the conventional pinned layers 16 and/or 24 may be a synthetic antiferromagnetic (SAF) layer including magnetic layers antiferromagnetically coupled through thin conductive layers, such as Ru. In such a SAF, multiple magnetic layers interleaved with a thin layer of Ru may be used.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy.

To switch the magnetization 21 of the conventional free layer 20, a current is driven perpendicular to plane (in the z-direction). When a sufficient current is driven between the top contact 30 and the bottom contact 11, the magnetization 21 of the conventional free layer 20 may switch to be parallel or antiparallel to the magnetization 17 of the conventional pinned layer 16. When a sufficient current is driven from the bottom contact 11 to the top contact 30, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Although the conventional dual MTJ 10 may be written using spin transfer and used in an STT-RAM, there are drawbacks. Use of the conventional dual MTJ 10 allows for a lower write current. However, for a high tunneling magnetoresistance (TMR) both a good separation of resistance area (RA) values between the tunneling barriers 18 and 22 as well as a low total RA for the conventional MTJ 10 are desired. For example, an RA of less than 5 $\Omega$-$\mu m^2$ is desired. In addition, a factor of five to ten between the RAs of the tunneling barriers 18 and 22 is desired. This translates to a thickness of on the order of 1 nm for the tunneling barrier layers 18 and 22. Because of these requirements, it may be difficult to manufacture a high quality tunneling barrier. For example, achieving a tunneling barrier 18 or 22 that is continuous, has the desired crystal structure, and the desired orientation may be problematic. Use of the conventional magnetic dual MTJ 10 may also have other drawbacks. For example, a read current driven through the conventional dual MTJ 10 may disturb the state of the free layer 20. For example, if the magnetization 21 of the conventional free layer 20 is in the –x direction in FIG. 1, then a read current driven through the conventional dual MTJ 10 in the z direction may result in a spin torque tending to switch the free layer magnetization 21 in the +x direction. Some portion of the conventional dual MTJs 10 in a magnetic memory may then be switched. In addition, the conventional dual MTJ 10 may be subject to stagnation for spin transfer-based switching. In particular, as a current is driven through the conventional dual MTJ 10, there is initially no spin torque because the charge carriers are aligned parallel or antiparallel to the magnetization 21 of the free layer 20. Thus, there is a stagnation point in switching which is undesirable. Once the magnetization 21 starts precessing, there is a torque on the magnetization 21 and the free layer 20 may be switched.

Accordingly, what is needed is a method and system that may improve the performance of the spin transfer torque based memories, preferably without sacrificing the lower switching current achieved through the use of a dual MTJ. The method and system described herein address such a need.

BRIEF SUMMARY OF THE INVENTION

A method and system for providing a magnetic memory is described. The method and system include providing magnetic memory elements corresponding to magnetic memory cells and providing at least one shift register. Each of the magnetic memory elements includes a pinned layer, a free layer, and a nonmagnetic spacer layer between the pinned and free layers. Each magnetic memory element is configured such that the free layer is switchable between a plurality of stable magnetic states when a write current is passed through the magnetic memory element. The shift register(s) correspond to the magnetic memory elements. Each of the shift register(s) include a plurality of domains separated by a plurality of domain walls. A domain of the plurality of domains is antiparallel to an adjoining domain. The shift register(s) are configured such that an equilibrium state aligns a portion of the plurality of domains with the plurality of magnetic memory elements. The shift register(s) are configured such that each of the domain walls is shifted to a location of an adjoining domain wall when a shift current is passed through the shift register(s) in a direction along adjoining domains.

DETAILED DESCRIPTION OF THE INVENTION

Figure 1:
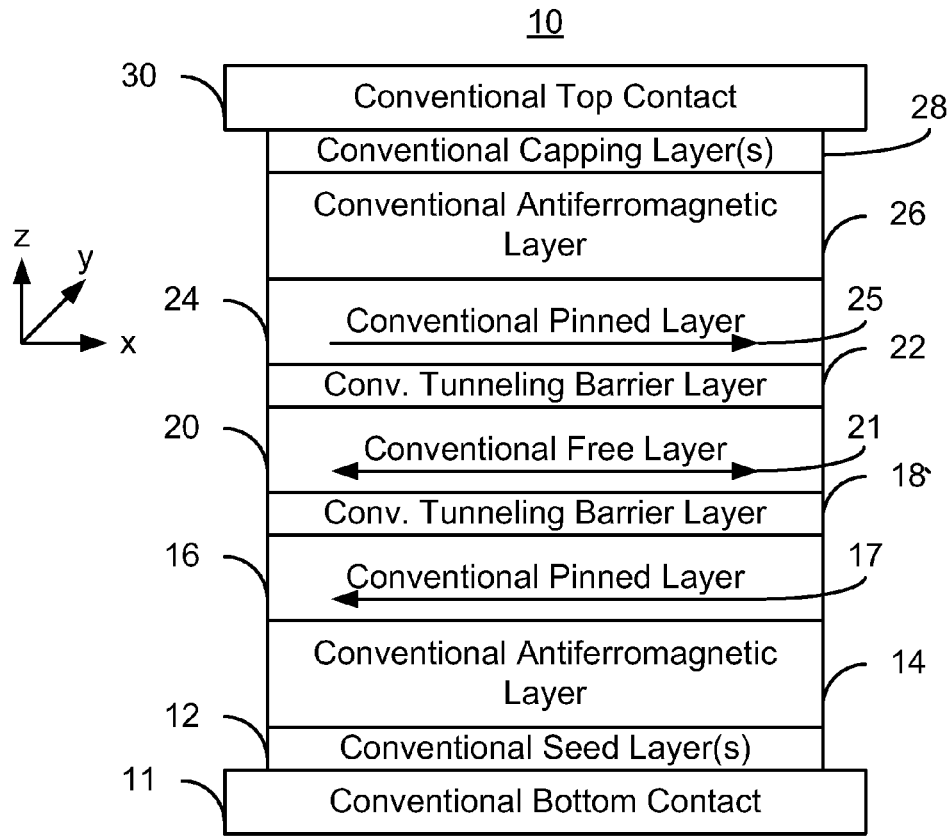
FIG. 1 depicts a conventional dual magnetic tunneling junction.

The exemplary embodiments relate to memories usable in devices and the magnetic junctions and other components used in such devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing and utilizing the magnetic memory are described. The exemplary embodiments provide methods and systems for providing a magnetic device. A method and system for providing a magnetic memory is described. The method and system include providing magnetic memory elements corresponding to magnetic memory cells and providing at least one shift register. Each of the magnetic memory elements includes a pinned layer, a free layer, and a nonmagnetic spacer layer between the pinned and free layers. Each magnetic memory element is configured such that the free layer is switchable between a plurality of stable magnetic states when a write current is passed through the magnetic memory element. The shift register(s) correspond to the magnetic memory elements. Each of the shift register(s) include a plurality of domains separated by a plurality of domain walls. A domain of the plurality of domains is antiparallel to an adjoining domain. The shift register(s) are configured such that an equilibrium state aligns a portion of the plurality of domains with the plurality of magnetic memory elements. The shift register(s) are configured such that each of the domain walls is shifted to a location of an adjoining domain wall when a shift current is passed through the shift register(s) in a direction along adjoining domains.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2A:
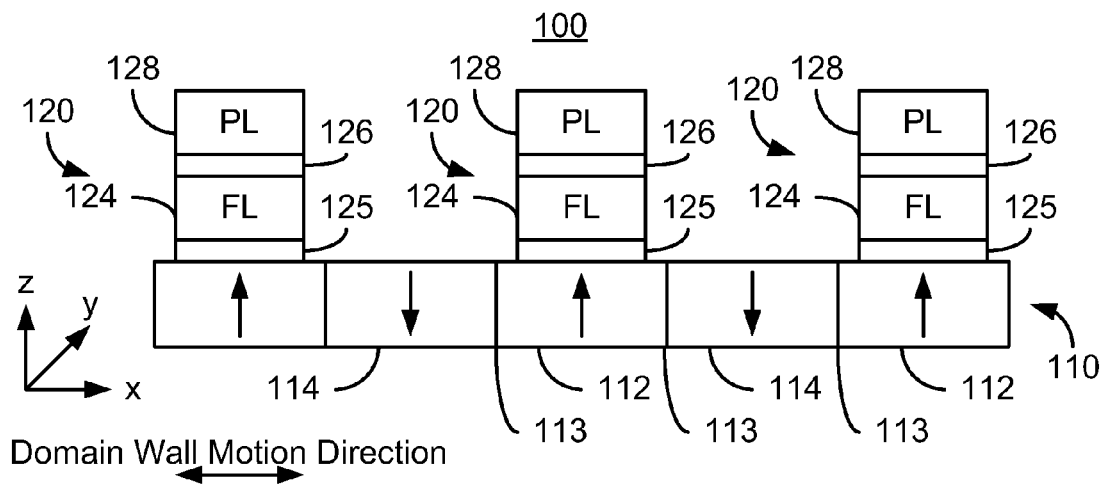
FIGS. 2A and 2B depict an exemplary embodiment of a magnetic memory employing a shift register.
Figure 2B:
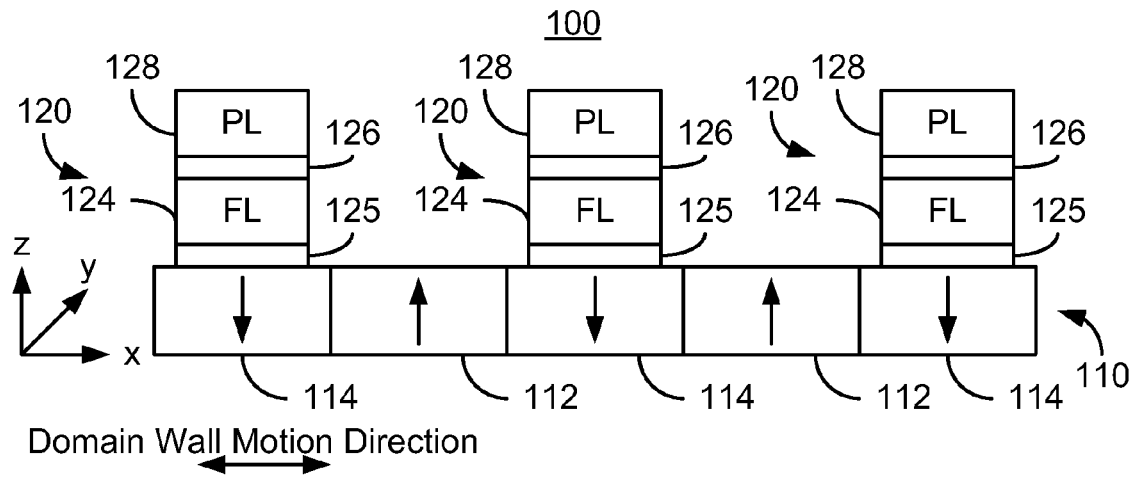

FIGS. 2A-2B depict an exemplary embodiment of a magnetic memory 100 that may use spin transfer torque for switching. In one embodiment, the memory is an STT-RAM. For clarity, FIGS. 2A-2B are not to scale. The magnetic memory 100 includes a shift register 110 and magnetic memory elements 120. Also shown is a nonmagnetic layer 125 between the magnetic memory elements 120 and the shift register 110 In some embodiments, the nonmagnetic layer 125 is conductive. In other embodiments, the nonmagnetic layer 125 is an insulator, for example, an MgO tunneling barrier layer. The magnetic memory elements 120 include at least a free layer 124, a nonmagnetic spacer layer 126, and a pinned layer 128. Thus, in some embodiments, the magnetic memory elements 120 include at least a single MTJ or spin valve. Although depicted as single layers, the free layer 124 and/or pinned layer 128 may also be a multilayer, such as a SAF structure. In some embodiments, the magnetic memory element 120 may include an optional pinning layer (not shown), which may be used to fix the magnetization (not shown) of the pinned layer 128. In some embodiments, the optional pinning layer may be an AFM layer or multilayer that pins the magnetization (not shown) of the pinned layer 128 by an exchange-bias interaction. However, in other embodiments, the optional pinning layer may be omitted or another structure may be used. Further, the magnetic memory element 120 may include other and/or additional layers such as optional seed layer(s) (not shown) and/or optional capping layer(s) (not shown). The magnetic memory element 120 is also configured to allow the free layer 124 to be switched between stable magnetic states when a write current is passed through the magnetic junction 120. Thus, the free layer 124 is switchable utilizing spin transfer torque.

The pinned layer 128 and free layer 124 are magnetic and thus may include one or more of Ni, Fe, and Co, particularly in an alloy form. Although depicted as a simple layer, the pinned layer 128 and/or the free layer 124 may include multiple layers. For example, the pinned layer 128 and/or the free layer 124 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 128 and/or the free layer 124 may also be another multilayer. Although magnetizations are not depicted in FIGS. 2A-2B, the free layer 124 and pinned layer 128 may have a perpendicular anisotropy energy that exceeds the out-of-plane demagnetization energy. Thus, the free layer 124 and pinned layer 128 may have a perpendicular to plane magnetization. The magnetization of the pinned layer 128 and the free layer 124 may thus be substantially normal to the plane of the free layer. In another embodiment, the perpendicular anisotropy in the free layer 124 and/or pinned layer 128 may be less than the out-of-plane demagnetization energy. In such a case, the free layer 124 and/or pinned layer 128 have an in-plane magnetization. The magnetization of the pinned layer 128 is substantially fixed, or pinned, in place. In contrast, the free layer 124 has a changeable magnetization (not shown) that may be switched via spin transfer.

The spacer layer 126 is nonmagnetic. In some embodiments, the spacer layer 126 is an insulator, for example a tunneling barrier. In such embodiments, the spacer layer 126 may include crystalline MgO, which may enhance the tunneling magnetoresistance (TMR) of the magnetic junction. In other embodiments, the spacer layer may be a conductor, such as Cu. In alternate embodiments, the spacer layer 126 might have another structure, for example a granular layer including conductive channels in an insulating matrix.

The magnetic memory element 120 may also include other layers. For example the magnetic memory element 120 may include additional space layer(s), as well as other structures. In some embodiments, described below, the magnetic memory element 120 incorporates a portion of the shift register 110.

The shift register 110 corresponds to the magnetic memory elements 120 and includes domains 112 and 114 separated by domain walls 113. The magnetizations of adjoining domains 112 and 114 are antiparallel. Thus, the domains 112 and 114 alternate. Although shown as being perpendicular to plane in FIGS. 2A and 2B, in other embodiments the magnetizations of the domain may be at least partially in plane. The shift register 110 is configured such that an equilibrium state aligns a portion of the plurality of domains with the plurality of magnetic memory elements. In the embodiment shown, the domains 112 are aligned with the magnetic memory elements 120. If the shift register is in another state, the domains 114 might be aligned with the magnetic memory elements 120 at equilibrium. Although only a single domain 114 in FIGS. 2A and 112 in FIG. 2B is shown between magnetic memory elements 120, in another embodiment, another number of domains may reside between the magnetic memory elements 120. In some embodiments, the domains 112 and 114 and the equilibrium positions of the domain walls 113 may be set. For example, the magnetic memory 100 may have notches (not shown) at the locations of the domain walls 113 to pin the domain walls 113 such that a domain 112 or 114 is aligned with each magnetic memory element 120.

The shift register is configured such that the domain walls 113 shift due to spin transfer torque. More specifically, a shift register current driven along the shift register 110 shifts the domain walls to the position of an adjoining domain wall. For example, suppose that the magnetic memory 100 shown in FIG. 2A is the equilibrium state of the magnetic memory 100. After application of a shift current, the domain walls 113 shift. This situation may be seen in FIG. 2B. Thus, the domains 114 are aligned with the magnetic memory elements 120. The shift register 110 may be switched between these states by application of a shift current in the positive or negative x direction.

In some embodiments, the shift register 110 is adjacent to the magnetic memory elements 120. In such embodiments, no portion of the shift register 110 is in stack. Stated differently, if a line is drawn directly down (perpendicular to the layers/in the z-direction) from the magnetic memory elements 120, no domain 112 or 114 is traversed by the line. In other embodiments, the shift register 110 may form a portion of the magnetic memory elements 120. In such embodiments, portions of the shift register 110 are in stack for the magnetic memory elements 120. For example, the domains 112 and/or 114 may function as a pinned layer in a single or dual MTJ. In such embodiments, the magnetic memory elements 120 form a remainder of the single or dual MTJ or spin valve.

In operation, the magnetic memory elements 120 and shift register 110 may be programmed using input currents. For example, a shift current may be applied in the plus or minus x direction to shift the domains 112 and 114 to have the desired domains 112 or 114 aligned with the magnetic memory elements 110. A write current may then be driven through the magnetic elements 120 in the plus or minus z direction to program the magnetic elements 120. Alternatively, a single current may be applied to both the shift register 110 and the desired magnetic elements 120. In such an embodiment, the current would both shift the domains 112 and 114 and write to the magnetic memory element 120.

Because of the use of the shift register 110, the domain 112 or 114 corresponding to the magnetic memory elements 120 may be changed, as seen in FIG. 2A versus FIG. 2B. As a result, different states may be used for reading and writing. For example, a domain 112 or 114 that improves the spin transfer torque efficiency can be selected as aligned with a magnetic element 120 for writing. Another domain 114 or 112 that improves the magnetoresistance and/or reduces the possibility of disturbing the state of the free layer 124 may be selected to be aligned with the magnetic memory element 120 for read operations. Thus, the magnetic memory 100 may have improved performance. In addition, because the domains 112 and 114 may be shifted, the stagnation point may be avoided in writing. Consequently, performance of the magnetic memory 100 may be improved.

Figure 3:
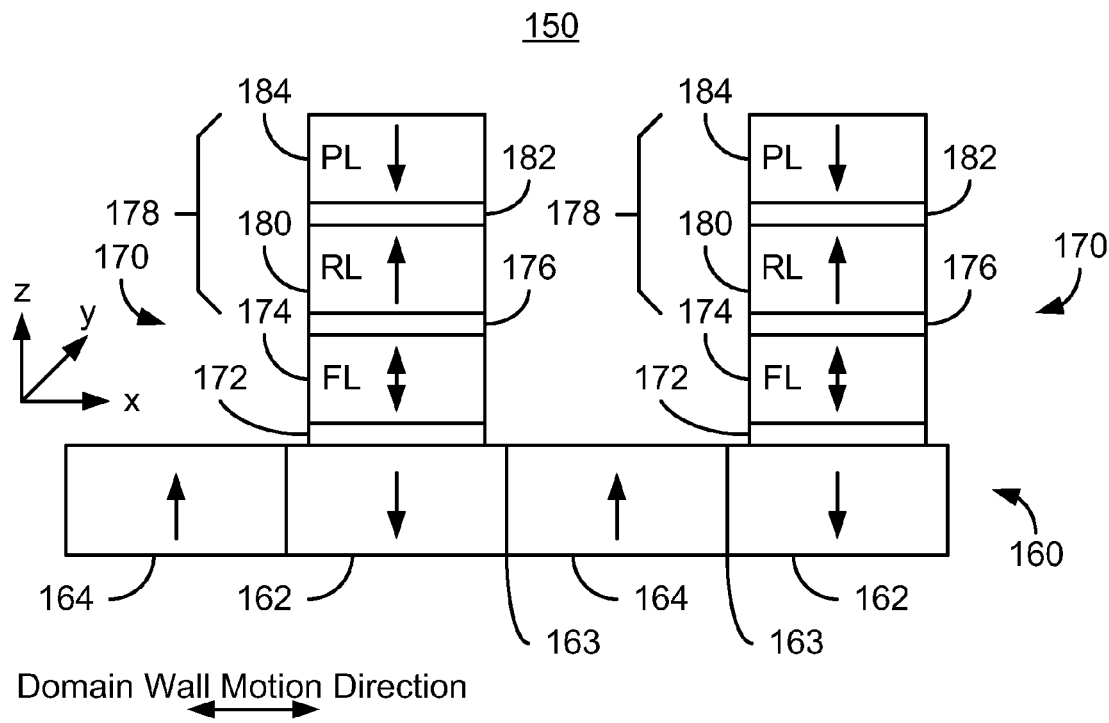
FIG. 3 depicts another exemplary embodiment of a magnetic memory employing a shift register.

FIG. 3 depicts another exemplary embodiment of a magnetic memory 150 that may use spin transfer torque for switching. In one embodiment, the memory 150 is an STT-RAM. For clarity, FIG. 3 is not to scale. The magnetic memory 150 is analogous to the magnetic memory 100. More specifically, the magnetic memory 150 includes a shift register 160 and magnetic memory elements 170 that are analogous to the shift register 110 and magnetic memory elements 120, respectively. The shift register 160 thus includes domains 162 and 164 separated by domain walls 163. Similarly, the magnetic memory element 170 includes a free layer 174, a nonmagnetic spacer layer 176, and a pinned layer 178. Although depicted as a single layer, the free layer 174 may also be a multilayer, such as a SAF structure. In some embodiments, the magnetic memory element 170 may include an optional pinning layer (not shown), which may be used to fix the magnetization (not shown) of the pinned layer 178. In some embodiments, the optional pinning layer may be an AFM layer or multilayer that pins the magnetization (not shown) of the pinned layer 178 by an exchange-bias interaction. However, in other embodiments, the optional pinning layer may be omitted or another structure may be used.

The free layer 174 and pinned layer 178 are each magnetic and thus may include one or more of Ni, Fe, and Co, particularly in an alloy form. The free layer 174 is configured to be switched between stable magnetic states using a write current passed through the magnetic junction 170. Thus, the free layer 174 is switchable utilizing spin transfer torque. In the embodiment shown, the pinned layer 178 is a SAF including magnetic layers 180 and 184 antiferromagnetically coupled through a thin nonmagnetic layer 182, such as Ru. In the embodiment shown, the pinned layer 178 and free layer 174 have magnetizations that are perpendicular to plane. In an alternate embodiment, the free layer 174 and/or pinned layer 178 may have an in-plane magnetization.

In addition, the magnetic memory elements 170 each include an additional nonmagnetic spacer layer 172 and a domain 162 or 164, depending upon the state of the shift register 160. The domains 162/164 act as a second pinned layer for the magnetic memory elements 170. The spacer layers 176 and 172 are nonmagnetic. In some embodiments, the spacer layers 176 and 172 are insulators, for example tunneling barriers. In such embodiments, the spacer layers 176 and 172 may include crystalline MgO, which may enhance the TMR and spin transfer torque efficiency of the magnetic junction. In other embodiments, the spacer layers 176 and 172 are may be a conductor, such as Cu. In alternate embodiments, the spacer layer layers 176 and 172 might have another structure, for example a granular layer including conductive channels in an insulating matrix. Thus, the magnetic memory elements 170 may be dual MTJs or dual spin valves.

The shift register 160 corresponds to the magnetic memory elements 170. The magnetizations of adjoining domains 162 and 164 are antiparallel. Thus, the domains 162 and 164 alternate. The shift register 160 is configured such that an equilibrium state aligns a portion of the plurality of domains 162 and 164 with the plurality of magnetic memory elements 170. In the embodiment shown, the domains 162 are aligned with the magnetic memory elements 170. Thus, the elements 170 are in a dual state because the magnetization of the domain 162 is antiparallel to the magnetization of the layer 180 of the pinned layer 178 closest to the free layer 174. In other states, the domain 164 may be parallel to the magnetic elements 170 at equilibrium. In such a situation, the magnetic elements 170 are in an anti-dual state because the magnetization of the domain 164 is parallel to the magnetization of the layer 180 closest to the free layer 174. Although only a single domain 164 is shown between magnetic memory elements 120, in another embodiment, another number of domains may reside between the magnetic memory elements 170. In some embodiments, the domains 162 and 164 and the equilibrium positions of the domain walls 163 may be set. For example, the magnetic memory 150 may have notches (not shown) at the locations of the domain walls 163 to pin the domain walls 163 such that a domain 162 or 164 is aligned with each magnetic memory element 170.

The shift register 160 is configured such that the domain walls 163 shift due to spin transfer torque. More specifically, a shift register current driven along the shift register 160 shifts the domain walls to the position of an adjoining domain wall. For example, suppose that the magnetic memory 150 is one equilibrium state of the magnetic memory 100. After application of a shift current, the domains walls 163 shift such that the location of the domains shifts over one domain. Thus, the magnetic memory 150 may be considered to employ dual magnetic memory elements 170 that have two pinned layers 162/164 and 178, one of which has a magnetic orientation that can be shifted as desired.

In general, the magnetic memory 150 is desired to be programmed with the magnetic memory elements 170 in a dual state. Thus, the domains 162 are desired to be antiparallel to the reference layers 180 of the magnetic memory elements 170 during writing, as is shown in FIG. 3. Such an alignment allows for a reduced TMR and a higher spin transfer torque. In contrast, the magnetic memory 150 may be desired to be read in an anti-dual state. Thus, the domains 164 are desired to be aligned with the magnetic memory elements 170 for reading. Such an alignment allows for a higher TMR and, therefore, a higher signal. Further, use of a dual magnetic element allows for a reduction in the critical current required to switch the state of the free layer 174. Thus, read and write performance of the magnetic memory 150 may be improved.

Figure 4:
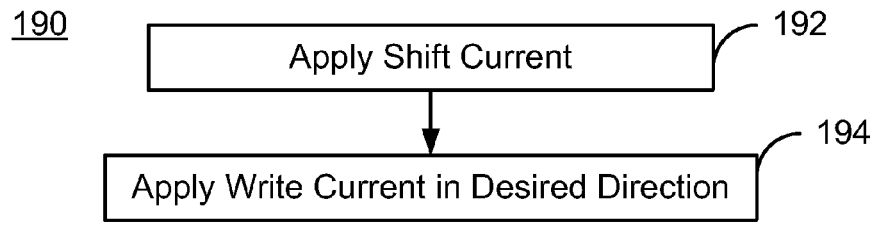
FIG. 4 is a flow chart depicting an exemplary embodiment of a method for programming a magnetic memory having a shift register.
Figure 5:
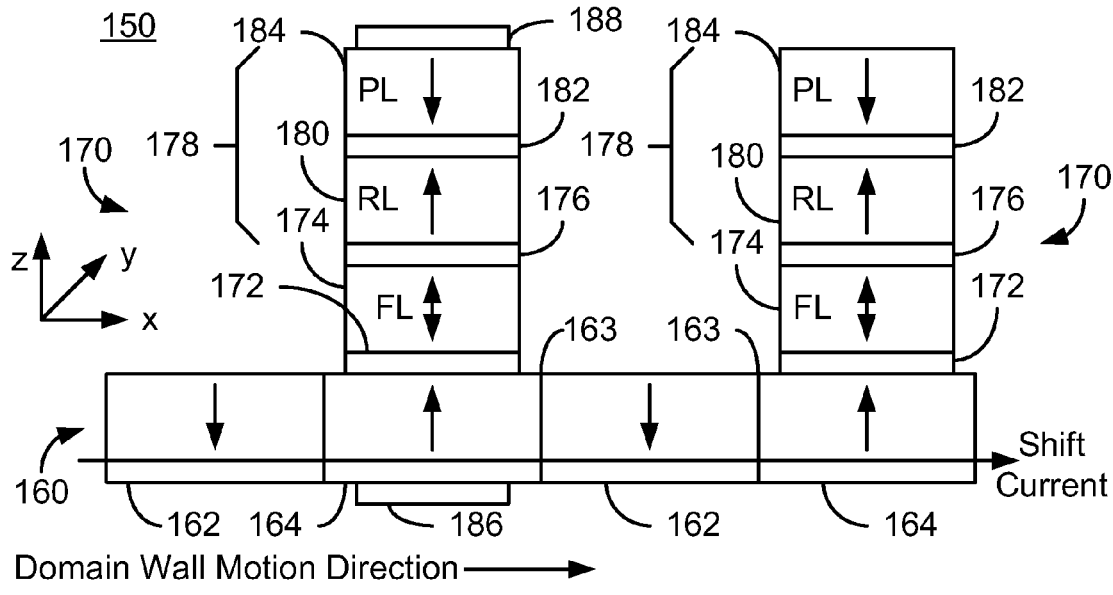
FIG. 5 depicts another exemplary embodiment of a magnetic memory employing a shift register in a first state during programming.
Figure 6:
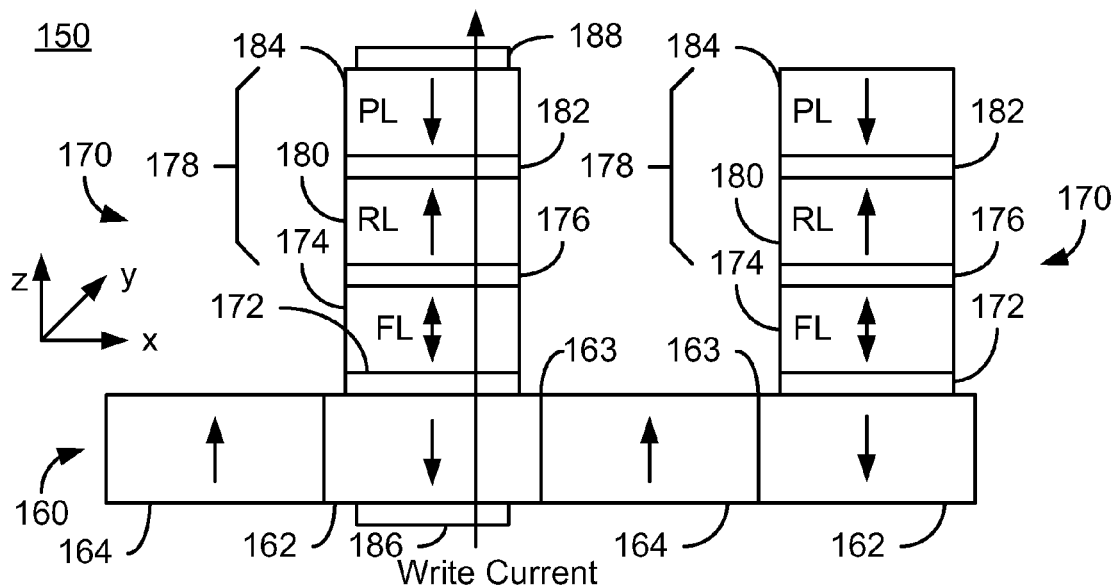
FIG. 6 depicts another exemplary embodiment of a magnetic memory employing a shift register in a second state during programming.

FIG. 4 depicts an exemplary embodiment of a method 190 for programming the magnetic memory 150. For simplicity, some steps may be omitted or combined. The method 190 is described in the context of the magnetic memory 150. However, the method 190 may be used on other magnetic memories that function in an analogous manner. FIGS. 5 and 6 depict exemplary embodiments of the magnetic memory 150 during programming. For clarity, FIGS. 5-6 are not to scale. In addition, contacts 186 and 188 are also shown in FIG. 5.

A shift current is driven through the shift register 160 corresponding to the plurality of magnetic memory elements 170 to be programmed, via step 192. FIG. 5 depicts the magnetic memory 150 during this step. In this case, the magnetic memory 150 starts in the anti-dual state. Thus, the domains 164 are aligned with the magnetic memory elements 170. The shift current is driven along the shift register 170 in the direction shown. The domain walls 163 move along the direction of current. Thus, the domain walls are moved until a domain 162 is aligned with the magnetic elements 170. FIG. 6 depicts the dual state obtained after the shift current has been driven through the shift register 160. This state is desired for programming the magnetic memory elements 170.

A write current is driven through the magnetic memory element(s) desired to be written, via step 194. In step 194, the current is driven between the contacts 186 and 188. FIG. 6 also depicts the direction of the write currents used for the magnetic elements 170. Based on whether the current is driven in the positive or negative z direction, the desired state can be programmed to the free layer 174 of each magnetic memory element 170.

Using the method 190, the desired state may be programmed into the magnetic memory elements 170. In the anti-dual state shown in FIG. 5, reading may be improved. In particular, the magnetoresistance may be increased because the orientation of the free layer 174 magnetization is the same with respect to the ferromagnetic layer 180 of the pinned layer 178 and the domain 164. Further, the possibility of disturbing the state of the free layer 174 may be reduced because in this state there is a cancellation of spin transfer torque effects observed on two surfaces of the free layer 174. Thus, the magnetic memory 100 may have improved read performance. Because the magnetic memory element 170 may be programmed in the dual state (domain 162 magnetization antiparallel to the magnetization of the layer 180). Because of the orientations of the magnetizations of the domain 162 and layer 180, magnetoresistance cancellation and a spin transfer torque increase occur during programming. In addition, because the domains 162 and 164 may be shifted as part of the method 190, the stagnation point may be avoided in writing. Consequently, performance of the magnetic memory 150 may be improved.

Figure 7:
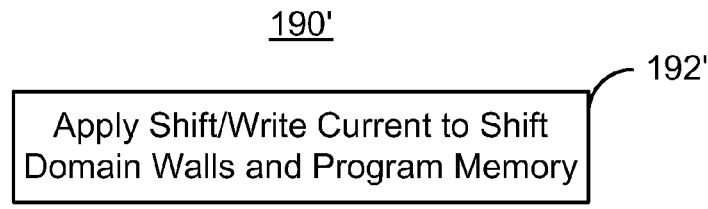
FIG. 7 is a flow chart depicting an exemplary embodiment of a method for programming a magnetic memory having a shift register.
Figure 8:
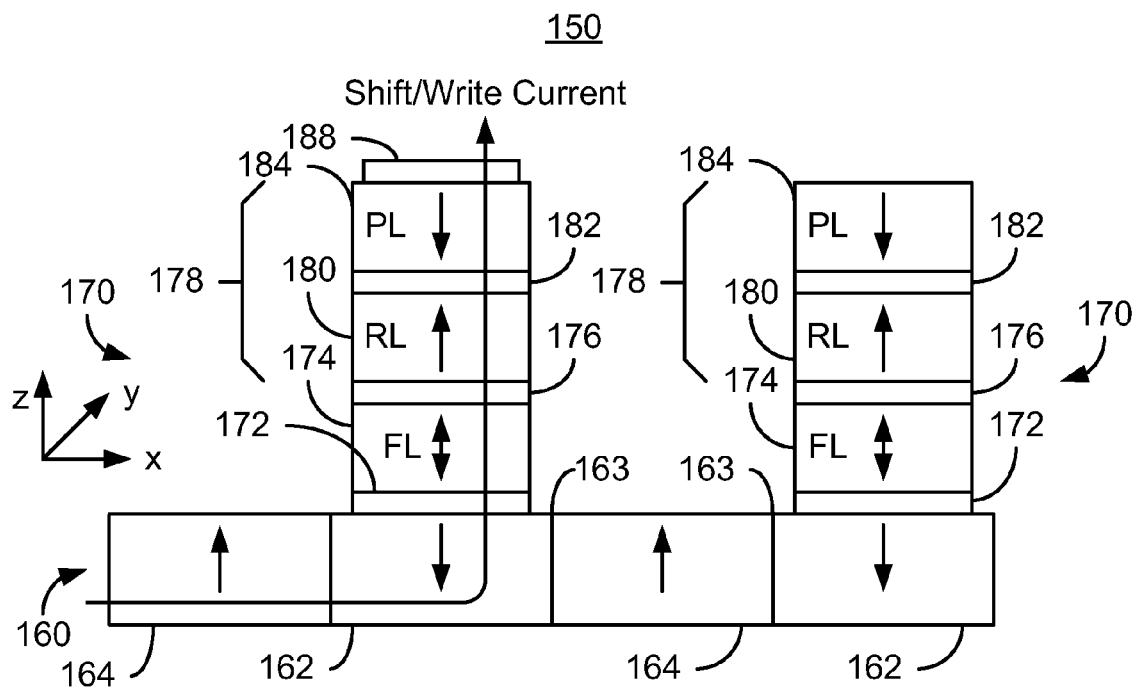
FIG. 8 depicts another exemplary embodiment of a magnetic memory employing a shift register during programming.

FIG. 7 depicts an exemplary embodiment of a method 190' for programming the magnetic memory 150. For simplicity, some steps may be omitted or combined. The method 190' is described in the context of the magnetic memory 150. However, the method 190' may be used on other magnetic memories that function in an analogous manner. FIG. 8 depicts an exemplary embodiment of the magnetic memory 150 during programming. For clarity, FIG. 8 is not to scale.

A combination shift and write current is driven through the shift register 160 corresponding to the plurality of magnetic memory elements 170 to be programmed and through the magnetic memory element(s) to be programmed, via step 192'. FIG. 8 depicts the magnetic memory 150 during this step. In this case, the magnetic memory 150 starts in the anti-dual state (not shown in FIG. 8). Thus, the domains 164 start off aligned with the magnetic memory elements 170. The shift/write current is driven along the shift register 170 and up through the desired magnetic element in the direction shown. The domain walls 163 move along the direction of current. Thus, the domain walls are moved until a domain 162 is aligned with the magnetic elements 170. Thus, the dual state shown in FIG. 8 is achieved and the magnetic memory element 170 written using the same current.

Using the method 190', the desired state may be programmed into the magnetic memory elements 170. In the anti-dual state (not shown in FIG. 8), reading may be improved. In particular, the magnetoresistance may be increased because the orientation of the free layer 174 magnetization is the same with respect to the ferromagnetic layer 180 of the pinned layer 178 and the domain 164. Further, the possibility of disturbing the state of the free layer 174 may be reduced. Thus, the magnetic memory 100 may have improved read performance. Because the magnetic memory element 170 may be programmed in the dual state (domain 162 magnetization antiparallel to the magnetization of the layer 180). Because of the orientations of the magnetizations of the domain 162 and layer 180, magnetoresistance cancellation and a spin transfer torque increase occur during programming. In addition, because the domains 162 and 164 may be shifted as part of the method 190, the stagnation point may be avoided in writing. Consequently, performance of the magnetic memory 150 may be improved.

Figure 9:
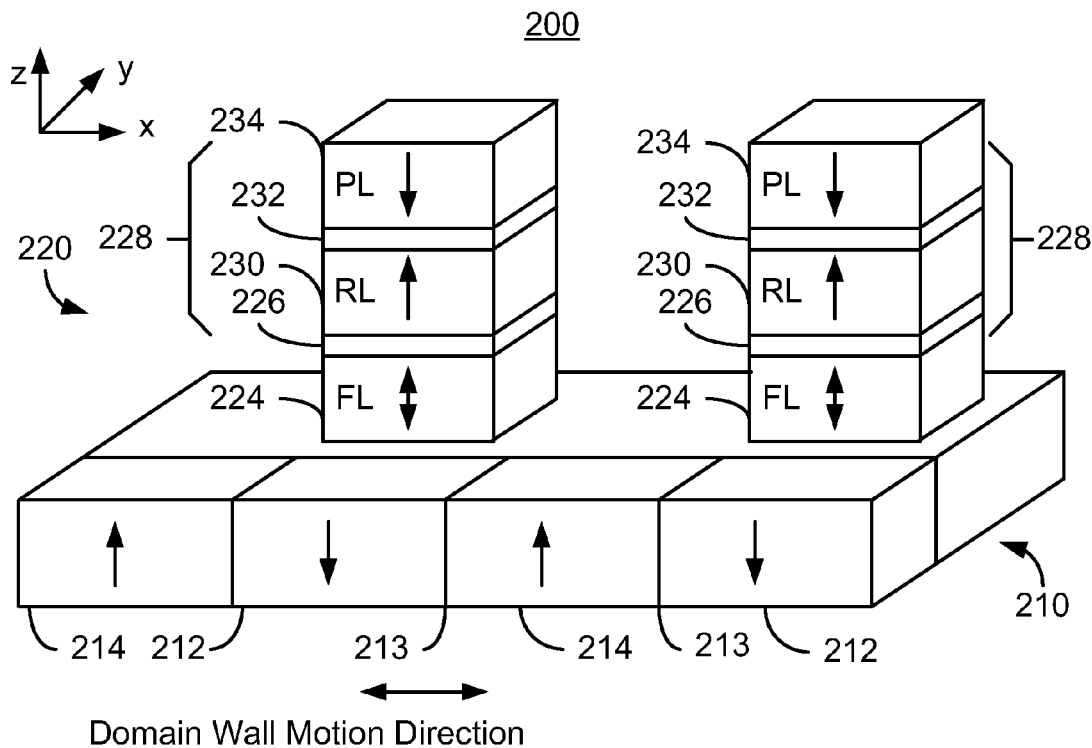
FIGS. 9-10 depict side and plan view of another exemplary embodiment of a magnetic memory employing a shift register.
Figure 10:
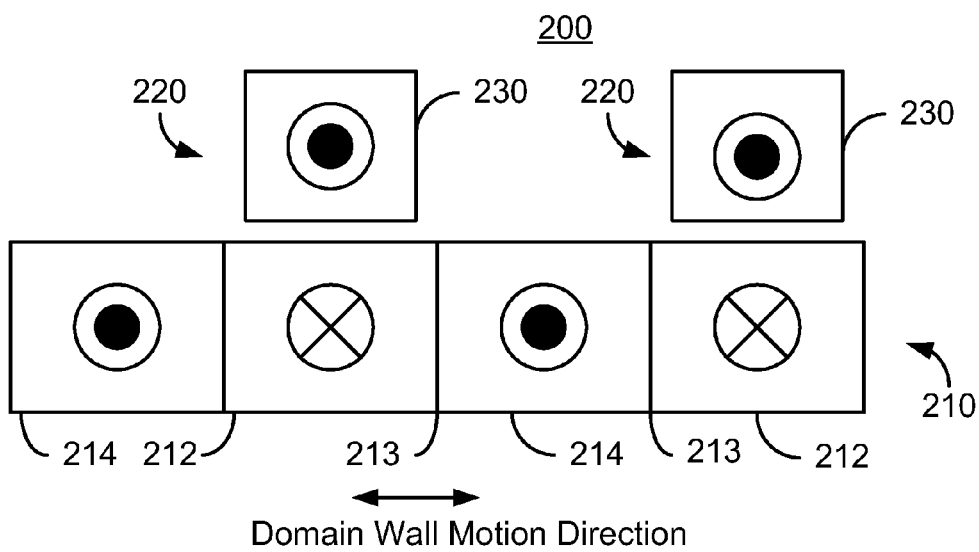

FIGS. 9 and 10 depict perspective and plan views of another exemplary embodiment of a magnetic memory 200 that may use spin transfer torque for switching. In one embodiment, the memory 200 is an STT-RAM. For clarity, FIGS. 9-10 are not to scale. The magnetic memory 200 is analogous to the magnetic memory 100. More specifically, the magnetic memory 200 includes a shift register 210 and magnetic memory elements 220 that are analogous to the shift register 110 and magnetic memory elements 120, respectively. The shift register 210 thus includes domains 212 and 214 separated by domain walls 213. Similarly, the magnetic memory element 220 includes a free layer 224, a nonmagnetic spacer layer 226, and a pinned layer 228. In some embodiments, therefore, the magnetic memory elements 220 are single junctions. In other embodiments, the magnetic memory elements 220 may include another spacer layer (not shown) and pinned layer (not shown). Thus, the magnetic memory elements 220 may be dual junctions. Although depicted as a single layer, the free layer 224 may also be a multilayer, such as a SAF structure. The pinned layer 228 is shown as a SAF structure including a reference layer 230, a spacer layer 232, and a pinned layer 234. However, in other embodiments, the pinned layer 228 may be a single layer or another multilayer. In some embodiments, the magnetic memory element 220 may include an optional pinning layer (not shown), which may be used to fix the magnetization (not shown) of the pinned layer 228. In some embodiments, the optional pinning layer may be an AFM layer or multilayer that pins the magnetization (not shown) of the pinned layer 228 by an exchange-bias interaction. However, in other embodiments, the optional pinning layer may be omitted or another structure may be used.

The free layer 224 and pinned layer 228 are each magnetic and thus may include one or more of Ni, Fe, and Co, particularly in an alloy form. The free layer 224 is configured to be switched between stable magnetic states using a write current passed through the magnetic junction 220. Thus, the free layer 224 is switchable utilizing spin transfer torque. In the embodiment shown, the pinned layer 228 and the free layer 224 have magnetizations that are perpendicular to plane. In an alternate embodiment, the free layer 224 and/or pinned layer 228 may have an in-plane magnetization.

The spacer layer 226 is nonmagnetic. In some embodiments, the spacer layers 226 is an insulator, for example a tunneling barrier. In such embodiments, the spacer layer 226 may include crystalline MgO, which may enhance the TMR of the magnetic junction. In other embodiments, the spacer layer 226 may be a conductor, such as Cu. In alternate embodiments, the spacer layer 226 might have another structure, for example a granular layer including conductive channels in an insulating matrix. Thus, the magnetic memory elements 220 may be dual MTJs or dual spin valves.

The shift register 210 corresponds to the magnetic memory elements 220. The magnetizations of adjoining domains 212 and 214 are antiparallel. Thus, the domains 212 and 214 alternate. The shift register 210 is configured such that an equilibrium state aligns a portion of the plurality of domains 212 and 214 with the plurality of magnetic memory elements 220. In the embodiment shown, the domains 212 are aligned with the magnetic memory elements 220. Although only a single domain 214 is shown between magnetic memory elements 220, in another embodiment, another number of domains may reside between the magnetic memory elements 220. In some embodiments, the domains 212 and 214 and the equilibrium positions of the domain walls 213 may be set. For example, the magnetic memory 200 may have notches (not shown) at the locations of the domain walls 213 to pin the domain walls 213 such that a domain 212 or 214 is aligned with each magnetic memory element 220.

The shift register 210 is configured such that the domain walls 213 shift due to spin transfer torque. More specifically, a shift register current driven along the shift register 210 shifts the domain walls to the position of an adjoining domain wall. For example, suppose that the magnetic memory 200 is one equilibrium state of the magnetic memory 200. After application of a shift current, the domains walls 213 shift such that the location of the domains shifts over one or more domain.

Figure 11:
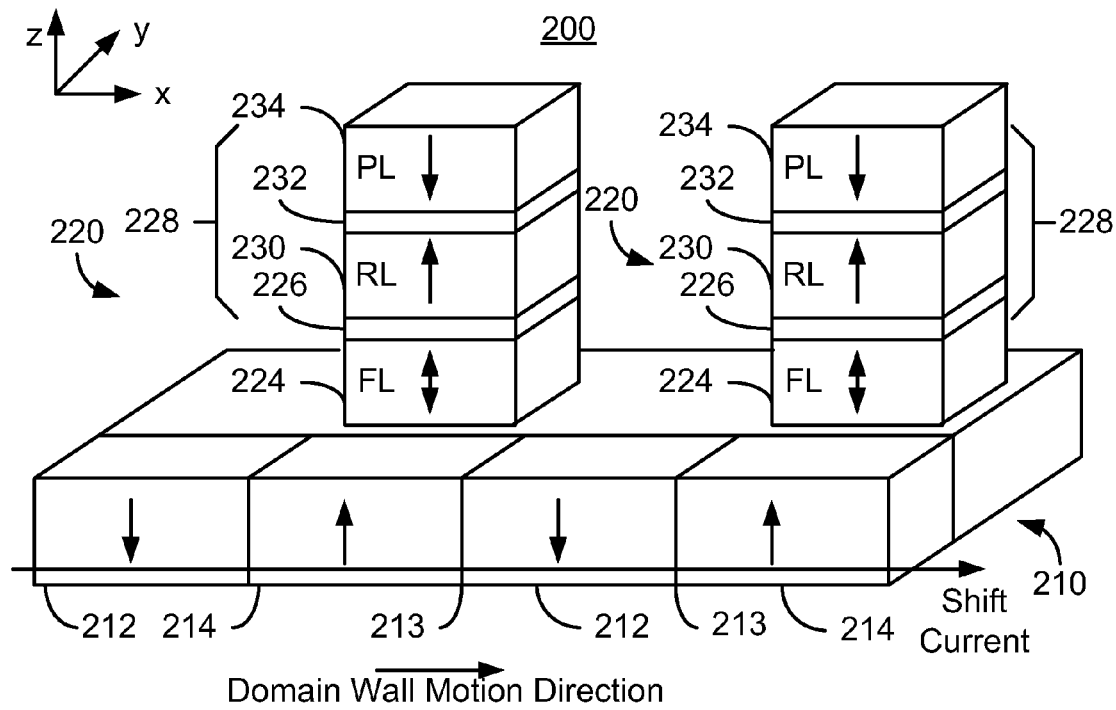
FIG. 11 depicts another exemplary embodiment of a magnetic memory employing a shift register in a second state during programming.

In contrast to the magnetic memory 150, the domains 212 and 214 of the shift register 210 are not part of the magnetic memory element 220. More specifically, the domains 212 and 214 are not in stack for the magnetic memory elements 220. Instead, the shift register 210 is adjacent the magnetic memory elements 220. Although shown as below the free layer (i.e. on a plane that is lower than the free layer), the shift register 210 may be on the same level as or higher than the free layer in some embodiments. As is shown in FIG. 11, the domains 212 and 214 of the shift register 210 may still be moved through the application of a current through the shift register 210.

In general, the magnetic memory 200 is desired to be programmed with the current passing through the shift register at the same time as the current passing through the magnetic memory elements 220. This causes the domain wall motion at the same time as the magnetization of the free layer is processing, which in turn causes change in magnetostatic field from the shift register onto the free layer and stagnation point in the free layer (the point, which has zero total torque) can be eliminated. Further, use of a dual magnetic element allows for a reduction in the critical current required to switch the state of the free layer 224. Thus, read and write performance of the magnetic memory 200 may be improved. During reading of the memory, the current is not passed through the shift register and there is no change in the magnetostatic field from the shift register onto the free layer, which in turn results in stagnation point of the free layer magnetization, reducing read disturb probability for fast reading.

Figure 12:
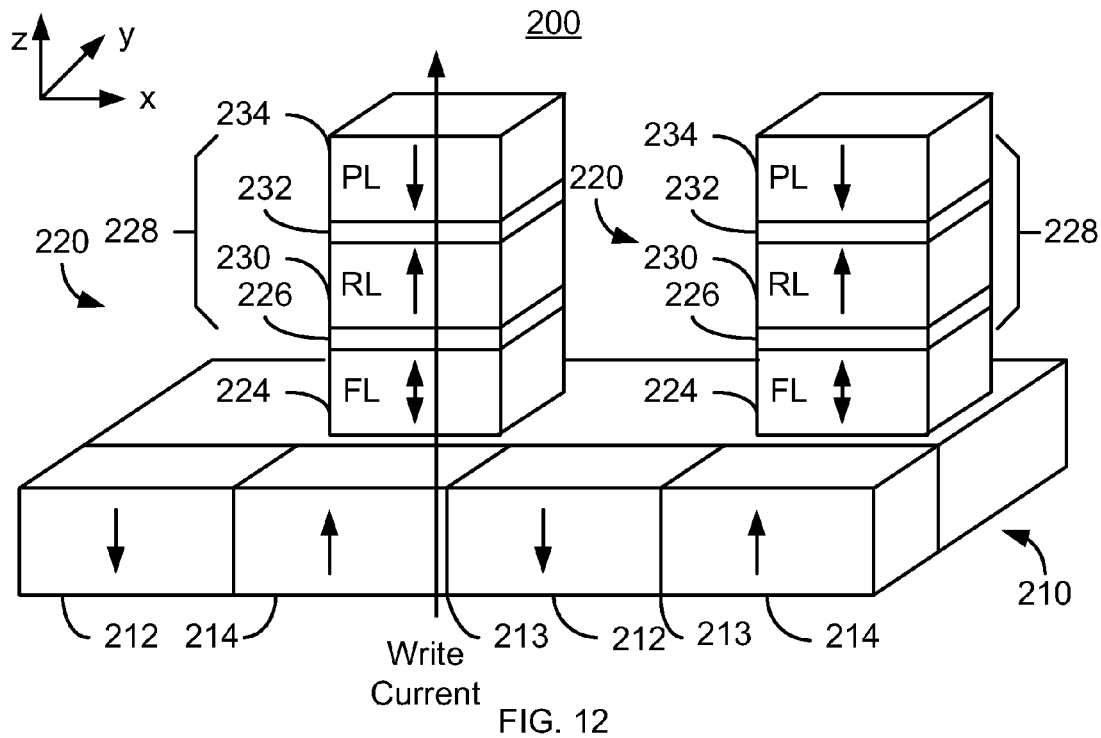
FIG. 12 depicts another exemplary embodiment of a magnetic memory employing a shift register.
Figure 13:
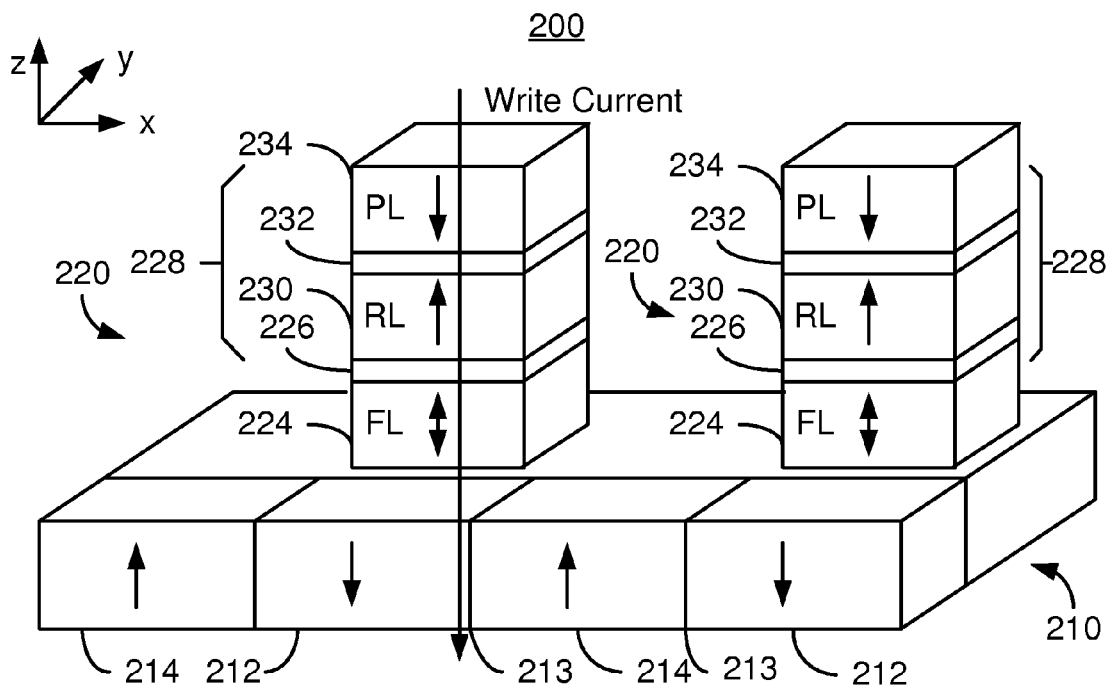
FIG. 13 depicts another exemplary embodiment of a magnetic memory employing a shift register.

FIGS. 12-13 depict programming of a magnetic memory element 220 when a write current is passed through the magnetic memory element 220. FIGS. 12-13 are not to scale. In the embodiment shown, the register layer 210 provides a magnetic field for biasing the free layer 224, particularly during spin transfer torque writing. Note that although the arrows indicating the direction of the write current in FIGS. 12-13 appear to traverse the register layer 210, the current need not flow through the register layer 210. In addition, although the domains 212 and 214 are depicted as perpendicular to plane, the domains 212 and 214 may be oriented in plane even if the free layer 224 is to be programmed perpendicular to plane. This is because the biasing field provided at the free layer 224 by the shift register 210 may be along the hard axis or the easy axis of the free layer 224.

The direction of current through the magnetic memory element 220 for programming the magnetic memory element into a first state is shown in FIG. 12. In FIG. 12, the domain 214 provides a magnetostatic field at the free layer 224 in the corresponding to the spin transfer torque due to the write current and the reference layer 230 tends to switch the magnetization of the free layer 224. FIG. 13 depicts the state of the register layer for programming the free layer 224 in the opposite state. In FIG. 13, the domain 212 provides a magnetostatic field at the free layer 224 in a direction corresponding to spin transfer torque due to the write current tends to switch the magnetic moment of the free layer 224. The domains 214 or 212 adjacent to the free layer 224 being programmed provide a magnetostatic field on the free layer 224 in the appropriate direction. As a result, the domains 212 and 214 can assist in biasing the moment of the free layer 224 in the direction in which the free layer 224 is desired to be written. Based on whether the current is driven in the positive or negative z direction and which domain 212 or 214 is adjacent to the magnetic memory element 220, the desired state can be programmed to the free layer 224 of each magnetic memory element 220.

Thus, the magnetic memory 200 may be written to and read from in a manner analogous to the magnetic memory 150. In some embodiments, the domains 212 and 214 may be shifted as part of the method 210. Shifting the domains 212 and 214 changes the magnetostatic field applied at the free layer 224 during writing. As a result, the stagnation point may be avoided in writing. Consequently, performance of the magnetic memory 200 may be improved.

Figure 14:
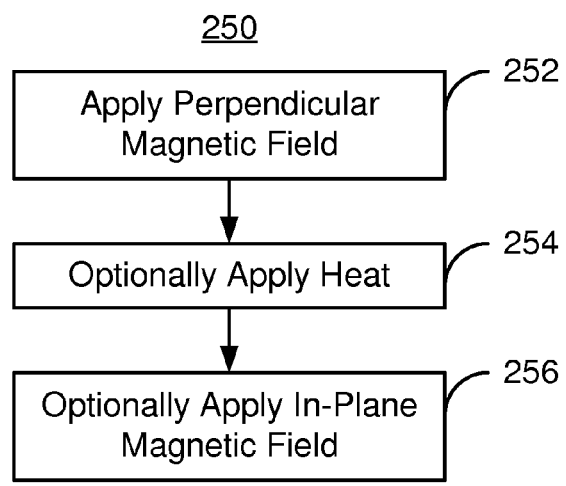
FIG. 14 is a flow chart depicting an exemplary embodiment of a method for initializing a magnetic memory employing a shift register.
Figure 15:
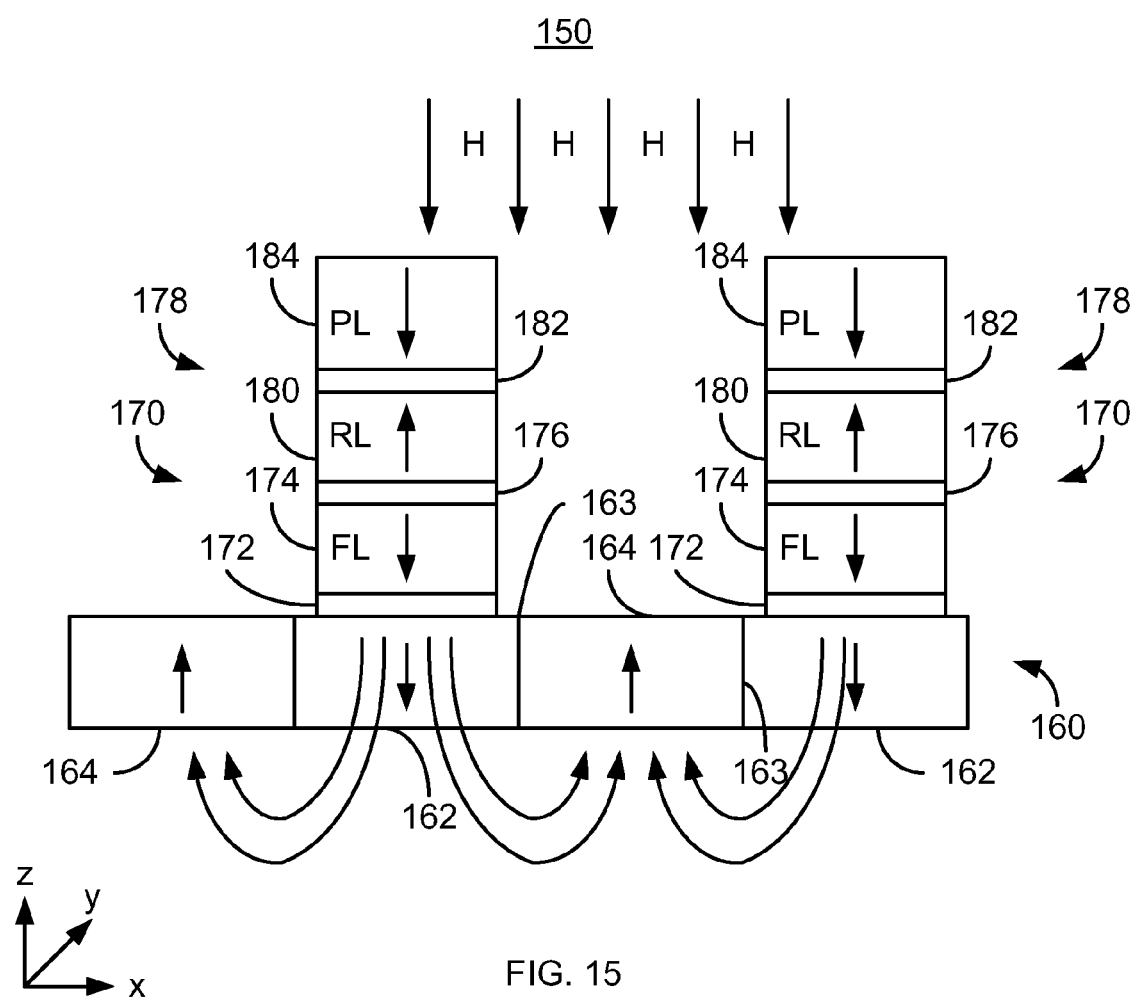
FIG. 15 depicts another exemplary embodiment of a magnetic memory employing a shift register during initialization.

FIG. 14 depicts an exemplary embodiment of a method 250 for initializing the magnetic memory 150 and/or 200. For simplicity, some steps may be omitted or combined. The method 250 is described in the context of the magnetic memory 150. However, the method 250 may be used on other magnetic memories that function in an analogous manner. FIG. 15 depicts an exemplary embodiment of the magnetic memory 150 during programming. For clarity, FIG. 15 is not to scale. Also, in the embodiment shown, the layer 184 of the pinned layer 178 has a higher saturation moment, for example due to the thickness of the layer 184.

A magnetic field is applied in a perpendicular direction to the magnetic memory elements 170 and the shift register 160 desired to be initialized, via step 252. The magnetic field is higher than the coercivity of the layer 184, the free layer 174, and the domains 162 and 164.

In some embodiments, the memory 150 is optionally heated, via step 254. In some embodiments, heating may be accomplished using a current driven through the shift register 160 and/or the magnetic elements 170. However, in other embodiments, the heating may be performed in another manner.

In some embodiments, an in-plane magnetic field is also applied, via step 256. This in-plane magnetic field may be sufficient to saturate the domains 162 and/or 164 or decrease the corcivity of the shift register. The heating and in-plane fields of steps 254 and 256 are optional and may be used to facilitate initialization of the magnetic memory 150.

FIG. 15 depicts the memory 150 as the field, H, is applied. Because of the magnetic field, the layer 184 of the pinned layer 178 as well as the free layer 174 are aligned with the magnetic field. In the embodiment shown, the domain 162 is also aligned with the field. Thus, the free layer 174, layer 184 of the pinned layer 178 or in some embodiments both 184 and 180 and, in some embodiments, the domain 162 provide a magnetostatic field antiparallel to the magnetic field at the domain 164. Thus, the net field (H plus the magnetostatic field from the magnetic memory element 170 and domain 162) on the domains 164 is opposite to the direction of the applied field. Stated differently, the applied field, H, is less than the magnetostatic field. As a result, the domains 164 are oriented in a direction opposite to the domains 162. Thus, the magnetic memory 150 may be initialized. The magnetic memories 100 and 200 may be initialized in an analogous fashion or in a completely different direction.

Using the method 250, the magnetic memory 100, 150, and/or 200 may be initialized. Thus, the benefits of the memory 100, 150, and/or 200 may be achieved.

A method and system for providing, using, and initializing a magnetic memory has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic memory comprising:
a plurality of magnetic memory elements corresponding to a plurality of magnetic memory cells, each of the plurality of magnetic memory elements including a pinned layer, a free layer, and a nonmagnetic spacer layer residing between the pinned layer and the free layer, each of the plurality of magnetic memory elements being configured such that the free layer is switchable between a plurality of stable magnetic states when a write current is passed through the magnetic memory element of the plurality of magnetic memory elements; and
at least one shift register corresponding to the plurality of magnetic memory elements, each of the at least one shift register including a plurality of domains separated by a plurality of domain walls, a domain of the plurality of domains being antiparallel to an adjoining domain, the at least one shift register being configured such that an equilibrium state aligns a portion of the plurality of domains with the plurality of magnetic memory elements, the at least one shift register being configured such that each of the plurality of domain walls is shifted to a location of an adjoining domain wall when a shift current is passed through the at least one shift register in a direction along adjoining domains.

2. The magnetic memory of claim 1 wherein each of the portion of the plurality of domains alternate with a non-aligned domain of the plurality of domains, the non-aligned domain residing between magnetic memory elements.

3. The magnetic memory of claim 2 wherein each the plurality of magnetic memory elements includes an additional nonmagnetic spacer layer and an aligned domain of the portion of the plurality of domains, the aligned domain being a reference layer such that the aligned domain is in-stack for the each of the plurality of magnetic memory elements.

4. The magnetic memory of claim 3 wherein at least one of the nonmagnetic spacer layer and the additional nonmagnetic spacer layer is a tunneling barrier layer.

5. The magnetic memory of claim 3 wherein the plurality of magnetic memory elements is configured to be read when the aligned domain and the pinned layer are in an anti-dual state.

6. The magnetic memory of claim 3 wherein the plurality of magnetic memory elements is configured to be written when the aligned domain and the pinned layer are in a dual state.

7. The magnetic memory of claim 3 wherein the free layer, the pinned layer, and the aligned domain each has a magnetization perpendicular to plane.

8. The magnetic memory of claim 3 wherein the pinned layer is a synthetic antiferromagnet (SAF) including a plurality of ferromagnetic layers separated by a nonmagnetic separation layer, the plurality of ferromagnetic layers being antiferromagnetically aligned.

9. The magnetic memory of claim 3 further comprising:
a plurality of contacts, each of the plurality of magnetic memory elements having a first contact and a second contact of the plurality of contacts, the first contact being adjacent to the aligned domain, the second contact being adjacent to the pinned layer.

10. The magnetic memory of claim 2 wherein the register layer is adjacent to a plurality of magnetic memory elements such that no domain of the plurality of domains is in stack for any of the plurality of magnetic memory elements.

11. The magnetic memory of claim 10 wherein the nonmagnetic spacer layer is a tunneling barrier layer.

12. The magnetic memory of claim 10 wherein the plurality of magnetic memory elements is configured to be read when each of the portion of the plurality of domains aligned with the plurality of magnetic memory elements and the pinned layer of an aligned magnetic memory element of the plurality of magnetic memory elements are in an anti-dual state.

13. The magnetic memory of claim 10 wherein the plurality of magnetic memory elements is configured to be written when each of the portion of the plurality of domains aligned with the plurality of magnetic memory elements and the pinned layer of an aligned magnetic memory element of the plurality of magnetic memory elements are in a dual state.

14. The magnetic memory of claim 10 wherein the free layer, the pinned layer, and each of the plurality of domains each has a magnetization perpendicular to plane.

15. The magnetic memory of claim 10 wherein the pinned layer is a synthetic antiferromagnet (SAF) including a plurality of ferromagnetic layers separated by a nonmagnetic separation layer, the plurality of ferromagnetic layers being antiferromagnetically aligned.

16. A method for programming a magnetic memory, the magnetic memory including a plurality of magnetic memory elements corresponding to a plurality of magnetic memory cells, each of the plurality of magnetic memory elements including a pinned layer, a free layer, and a nonmagnetic spacer layer residing between the pinned layer and the free layer, each of the plurality of magnetic memory elements being configured such that the free layer is switchable between a plurality of stable magnetic states when a write current is passed through the magnetic memory element of the plurality of magnetic memory elements, the method comprising:
driving a shift current through at least one shift register corresponding to the plurality of magnetic memory elements, each of the at least one shift register including a plurality of domains separated by a plurality of domain walls, a domain of the plurality of domains being antiparallel to an adjoining domain, the at least one shift register being configured such that an equilibrium state aligns a portion of the plurality of domains with the plurality of magnetic memory elements, the at least one shift register being configured such that each of the plurality of domain walls is shifted to a location of an adjoining domain wall when the shift current is passed through the at least one shift register in a direction along adjoining domains such that each of the plurality of magnetic memory elements is in a dual state with the portion of plurality of domains; and driving the write current through at least one of the plurality of magnetic memory elements being written.

17. A method for programming a magnetic memory, the magnetic memory including a plurality of magnetic memory elements corresponding to a plurality of magnetic memory cells, each of the plurality of magnetic memory elements including a pinned layer, a free layer, and a nonmagnetic spacer layer residing between the pinned layer and the free layer, each of the plurality of magnetic memory elements being configured such that the free layer is switchable between a plurality of stable magnetic states when a write current is passed through the magnetic memory element of the plurality of magnetic memory elements, the method comprising:

driving the write current through at least a portion of at least one shift register corresponding to the plurality of magnetic memory elements and through at least one of the plurality of magnetic memory elements being written, each of the at least one shift register including a plurality of domains separated by a plurality of domain walls, a domain of the plurality of domains being antiparallel to an adjoining domain, the at least one shift register being configured such that an equilibrium state aligns a portion of the plurality of domains with the plurality of magnetic memory elements, the at least one shift register being configured such that each of the plurality of domain walls is shifted to a location of an adjoining domain wall when the write current is passed through the at least one shift register in a direction along adjoining domains such that each of the plurality of magnetic memory elements is in a dual state with the portion of plurality of domains.

18. A method for initializing a magnetic memory, the magnetic memory including a plurality of magnetic memory elements corresponding to a plurality of magnetic memory cells, each of the plurality of magnetic memory elements including a pinned layer, a free layer, and a nonmagnetic spacer layer residing between the pinned layer and the free layer, each of the plurality of magnetic memory elements being configured such that the free layer is switchable between a plurality of stable magnetic states when a write current is passed through the magnetic memory element of the plurality of magnetic memory elements, the method comprising:

applying a magnetic field in a perpendicular direction to at least a portion of the plurality of magnetic memory elements and at least one shift register corresponding to the plurality of magnetic memory elements, each of the at least one shift register including a plurality of domains separated by a plurality of domain walls, a domain of the plurality of domains being antiparallel to an adjoining domain, the at least one shift register being configured such that an equilibrium state aligns a portion of the plurality of domains with the plurality of magnetic memory elements, the at least one shift register being configured such that each of the plurality of domain walls is shifted to a location of an adjoining domain wall when a shift current is passed through the at least one shift register in a direction along adjoining domains;

wherein at least the free layer and the pinned layer provide a magnetostatic field antiparallel to the magnetic field at an additional portion of the plurality of domains between the plurality of magnetic memory elements such that each of the portion of the plurality of domains alternate with a non-aligned domain of the plurality of domains, the non-aligned domain residing between magnetic memory elements.

19. The method of claim 18 further comprising:
heating at least a portion of the magnetic memory.

20. The method of claim 18 wherein the step of heating further includes:
driving a current through the at least one shift register.

21. The method of claim 18 further comprising:
applying an in-plane magnetic field.

22. The method of claim 21 wherein the in-plane magnetic field saturates each of the plurality of domains.

* * * * *